United States Patent [19]
Rosenfeld

[11] Patent Number: 5,329,996
[45] Date of Patent: Jul. 19, 1994

[54] POROUS LAYER HEAT EXCHANGER

[75] Inventor: John H. Rosenfeld, Lancaster, Pa.

[73] Assignee: Thermacore, Inc., Lancaster, Pa.

[21] Appl. No.: 157,914

[22] Filed: Nov. 24, 1993

Related U.S. Application Data

[63] Continuation-in-part of Ser. No. 2,329, Jan. 8, 1993, Pat. No. 5,267,611.

[51] Int. Cl.$^5$ ................................................ F28F 3/02
[52] U.S. Cl. .................................... 165/168; 165/170; 165/185; 165/907
[58] Field of Search ............ 165/185, 168, 170, 104.26, 165/907, 80.1, 80.3; 122/366; 361/690–697

[56] References Cited

U.S. PATENT DOCUMENTS

| | | | |
|---|---|---|---|
| 3,201,858 | 8/1965 | Valyi | 165/907 |
| 3,598,180 | 8/1971 | Moore, Jr. | 165/104.26 |
| 3,750,745 | 8/1973 | Moore, Jr. | 165/104.26 |
| 4,359,086 | 11/1982 | Sanborn et al. | 165/907 |
| 4,768,581 | 9/1988 | Gotwald et al. | 361/697 |
| 4,787,443 | 11/1988 | Fukatsu et al. | 165/907 |
| 4,851,965 | 7/1989 | Gabuzda et al. | 361/691 |
| 4,884,631 | 12/1989 | Rippel | 361/697 |
| 4,896,719 | 1/1990 | O'Neill et al. | 165/907 |
| 4,903,761 | 2/1990 | Cima | 122/366 |
| 5,002,122 | 3/1991 | Sarraf et al. | 165/104.26 |
| 5,145,001 | 9/1992 | Valenzuela | 165/907 |
| 5,205,353 | 8/1993 | Willemsen et al. | 165/170 |

Primary Examiner—Albert W. Davis, Jr.
Attorney, Agent, or Firm—Martin Fruitman

[57] ABSTRACT

The invention is a cooling structure for a high power density surface. Fluid is pumped along interconnected and continuous multiple channels on the backside of a sintered metal wick bonded to the cooled surface. The channels are located within a fluid layer which also includes multiple fluid holes, so that each hole is surrounded by interconnected channels. The holes are connected to a manifold to collect or supply the pumped fluid. The channels which surround each hole are connected to another manifold attached to the structure, and the proximity of the channels to the holes assures that fluid flow resistance within the sintered metal wick is minimized by the multiple short, wide paths.

3 Claims, 2 Drawing Sheets

POROUS LAYER HEAT EXCHANGER

This application is a continuation in part of U.S. Pat. application Ser. No. 08/002,329, now U.S. Pat. No. 5,267,611 granted Dec. 7, 1993 for Single Phase Porous Layer Heat Exchanger by John H. Rosenfold.

SUMMARY OF THE INVENTION

This invention deals generally with heat transfer from a high power density surface, and more specifically with a structure for cooling such a surface by means of a porous layer through which liquid or gas is pumped.

Cooling a high power density surface, that is, a surface to which intense heat is being delivered, is a particularly difficult problem. If the heat is delivered to the surface in multiple locations, or generally across the entire surface, the heat removal must similarly be over the entire surface. In the simplest configurations, such as with liquid flowing through cooling pipes attached to the backside of the heated surface, just the thermal resistance along the heated surface between the heat input point and the heat removal pipe can permit the surface temperature to rise too high.

Even with the use of evaporation cooling it is difficult to accomplish reliable cooling of such a surface. One reason is that high heat input at one location can create a high vapor pressure at that point and prevent additional liquid from reaching that location for generation of additional cooling vapor. Such a situation can lead to destruction of the surface.

Although there have been some approaches to cooling a heated surface without the use of evaporation, they also have not proven entirely satisfactory. U.S. Pat. No. 4,896,719 by O'Neill et al suggests one approach for cooling a surface of low or medium power density. That patent discloses a manifold structure having a large number of identically configured, closely, and equally spaced orifices to deliver a heat exchange medium to the backside of a porous layer bonded to the heated surface. The heat exchange medium is continuously removed from the porous layer by a complimentary group of exhaust openings which are located in a pattern so that they are located between the delivery orifices. The O'Neill et al design intentionally used the delivery orifices to create the major pressure drop in the cooling medium flow path in order to assure that all the orifices deliver equal cooling medium and thereby maintain the heated panel as isothermal.

The present invention uses an entirely different structure for delivery of a liquid or gas coolant to a porous surface, because experimentation has shown that the pressure drop created at orifices such as O'Neill et al use is a major limitation on the ability to cool high power density surfaces. In effect, in order to attain uniform temperatures across the cooled panel, O'Neill et al use a specific structure which sacrifices cooling ability.

Instead, the goal of the present invention is to eliminate as much pressure drop from the fluid delivery system as is possible, and the result is a system in which the only significant pressure drop is that inherent within the porous metal panel through which the delivered liquid or gas flows.

The present invention accomplishes this low pressure drop fluid delivery by the use of a network of interconnected channels which creates a grid through which fluid continuously flows in series with a thin porous layer bonded to the back of the heated surface. A fluid central port is located within each "island" area set off by the channels of the grid. Thus, when the fluid is a liquid, within the porous layer it generally flows in a wide cross section path out of the boundary channels around each "island", through the porous metal island, and to the central port. Under such flow conditions, not only is the pressure drop extremely low within the fluid feed system, but also, because of the relatively large cross section paths within the porous metal layer, the pressure drop is also low in the porous metal itself. In the case of a gas being used as the fluid, it is sometimes desirable to reverse the fluid flow, which can result in a lower pressure drop.

This low pressure drop permits delivery of much more cooling gas or liquid to the heated panel, and therefore maintains a low temperature rise within the porous metal layer and its adjacent heated surface. The result is more efficient and more uniform cooling of high power density surfaces than has ever been attained. Furthermore, because the design of the system is modular, there is no limit on the size of the surface which can be cooled. There is no practical difference in the effective cooling whether the dimensions of the cooled panel are measured in millimeters or in meters.

DETAILED DESCRIPTION OF THE INVENTION

Figure 1:
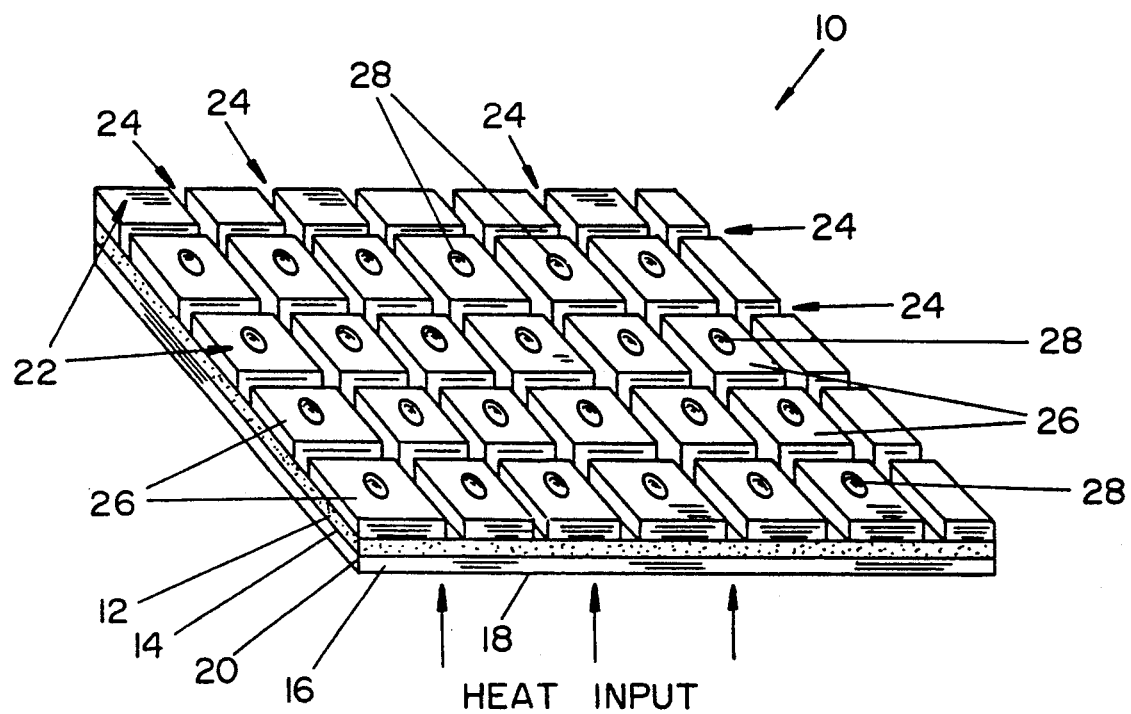
FIG. 1 is a perspective view of an internal portion of the preferred embodiment of the heat exchanger of the invention showing the network of interconnected fluid channels within the heat exchanger.

The internal structure of a portion 10 of the heat exchanger of the preferred embodiment is shown in FIG. 1 in which porous metal layer 12 is bonded to backside 14 of panel 16 to which heat is applied. Backside 14 of heated panel 16 is that surface opposite from surface 18 to which heat is applied, and backside 14 is separated from heated surface 18 by thickness 20 of heated panel 16.

Fluid layer 22 is attached to the surface of porous metal layer 12 opposite from the surface bonded to heated panel 16, so that the three layers form a unit with porous metal layer 12 sandwiched between fluid layer 22 and heated panel 16.

Fluid layer 22 is constructed of material which is impervious to the fluid coolant which is used within the heat exchanger, and a network of interconnected continuous channels 24 is formed within layer 22 so that the channels create a pattern of islands 26 within fluid layer 22. Channels 24 each have one wall which is actually the surface of porous metal layer 12, so that fluid flowing within channels 24 has direct access to porous metal layer 12. Islands 26 have holes 28 within them. Holes 28 penetrate from the top surface of fluid supply layer 22 through to porous metal layer 12, and therefore also have direct access to porous metal layer. 12.

For example, when used with a liquid, channels 24 are used to supply heat exchange fluid to porous metal layer 12, while holes 28 are used as outlet ports through which the heat exchange fluid exits porous metal layer 12. Thus, fluid supplied through interconnected channels 24 flows into and through porous metal layer 12, and then flows out of porous metal layer 12 through holes 28. Because of the repetitive pattern of channels 24 and holes 28, the flow of fluid is through multiple paths, each flow path being from the channels around each hole and into the hole. Such a flow path not only provides a low pressure drop fluid feed to porous layer 12 because of the large entry surface from multiple channels 24 around each island 20, but also yields a low pressure drop within porous layer 12 because of the wide effective width of the fluid flow path from channels 24 to holes 28.

In a typical structure, channels 24 are constructed with a width of 0.023 inch and a height 0.20 inch and are spaced at 0.236 inch on their centers, while outlet holes 28 are 0.062 inch diameter and are also laid out in a pattern of 0.236 inch spacing at their centers. With such a structure on a four inch diameter panel, with a 0.03 inch thick porous layer of copper material with grain size of 0.01 inch, and with a flow of water at a rate of 0.05 to 0.5 GPM for each island 26, a heat input of 1000 watts per square inch results in a fluid temperature rise of 3 to 30 degrees centigrade while maintaining the panel temperature rise below 50 degrees centigrade.

Alternate fluids such as gases such as air, helium and hydrogen, or liquids such as water, ammonia and glycol can also be used with the structure shown. With gases, however, reversed flow, with holes 28 feeding fluid to porous metal layer 12 may be desirable for meet effective heat transfer.

Figure 2:
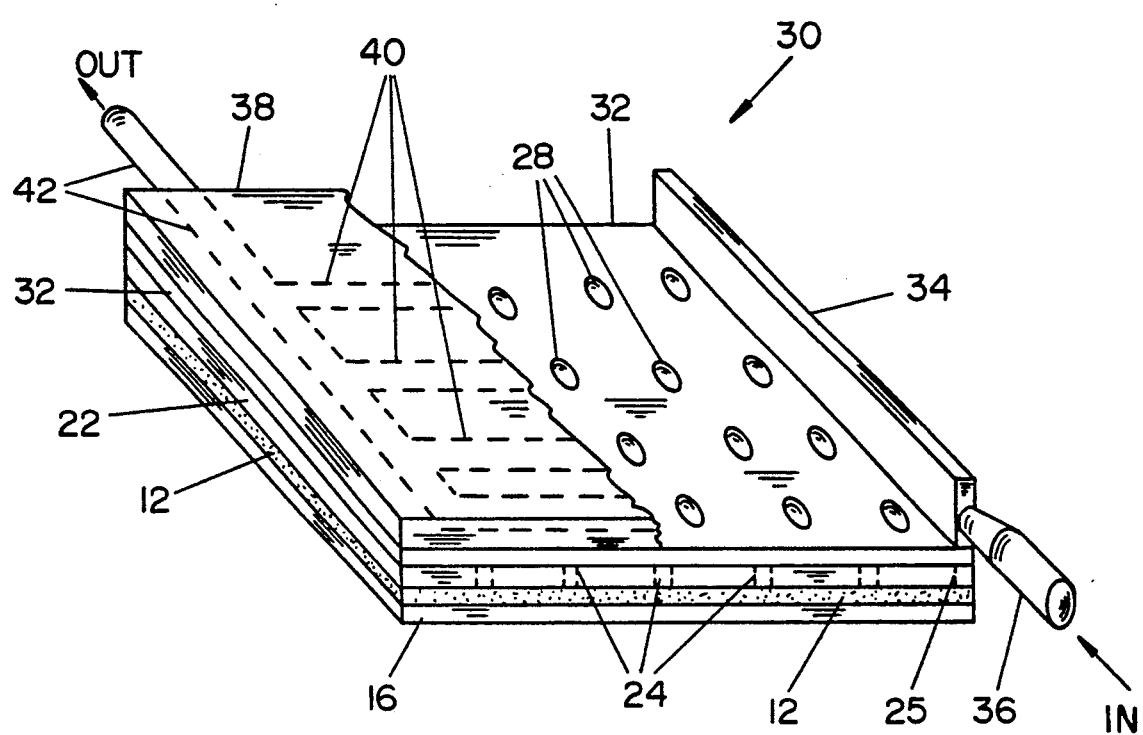
FIG. 2 is a cut away perspective view of a portion of the preferred embodiment of the invention showing the manifolds for feeding and removing fluid from the heat exchanger.

FIG. 2 is a cut away view of a portion of heat exchanger 30 which shows the manifold structures used to supply and remove the heat exchanger fluid from the internal structure shown in FIG. 1.

In order to feed channels 24, manifold 34 is connected to any channel 25, and sealing layer 32 is attached to the top of fluid layer 22 (FIG. 1), thus fully enclosing all the other channels 24. Pipe 36 is connected to manifold 34, and heat exchange fluid is then supplied to pipe 36 under pressure, so that, by flowing through manifold 24, through channel 25 to which manifold 34 is connected, and all other channels 24, the fluid is forced through porous metal layer 12 and into holes 28.

Sealing layer 32 includes extensions of holes 28, so that fluid flowing-through holes 28 reaches manifold layer 38, within which are located channels 40. Channels 40 are connected to and feed the fluid into manifold 42 from which it exits the heat exchanger. Reverse flow is also possible, of course, with manifold 42 acting as the feed manifold and manifold 34 acting as the outlet manifold.

This short, low pressure drop path permits efficient cooling of high power density surfaces with low coolant flow rate and near isothermal coolant temperature.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, various gases or liquids could be used for the heat exchange fluid, different supply and outlet manifold configurations could be used, and different size channels and outlet holes are clearly possible. Moreover, the channels need not be straight, and the sealing layer and the fluid layer can be combined into one continuous structure.

What is claimed as new and for which Letters Patent of the United States are desired to be secured is:

1. A heat exchanger structure comprising:
   a heated structure including a heated surface and a second surface attached to the heated surface;
   a porous layer with a first surface and a second surface, the first and second surfaces separated by the thickness of the layer, and the first surface of the porous layer being in contact with the second surface of the heated structure;
   a fluid layer with a first surface and a second surface, the first and second surfaces separated by the thickness of the layer, and the first surface of the fluid layer being in contact with the second surface of the porous layer, the fluid layer including a network of intersecting, continuous and interconnected channels, the channels forming sections of the fluid layer which are islands separated from each other by the channels, with one boundary of the channels being formed by the porous layer, and the fluid layer also including at least one hole, each hole located in an island formed by the channels within the fluid layer;
   a sealing layer which seals the second surface of the fluid layer-to enclose the channels, and includes extensions aligned with the holes in the fluid layer, so that, with the extensions, the holes penetrate through the sealing layer;
   a first manifold structure interconnected with the extensions of the holes in the sealing layer and also interconnected with a first pipe; and
   a second manifold interconnected with at least one channel in the fluid layer and also interconnected with a second pipe.

2. The heat exchanger structure of claim 1 wherein the heated structure is a panel and the heated surface of the heated structure and the second surface of the heated structure are separated by the thickness of the panel.

3. The heat exchanger structure of claim 1 wherein the channels are straight and they intersect each other at right angles.

* * * * *